United States Patent [19]
Sefton

[11] 4,125,783
[45] Nov. 14, 1978

[54] TOUCH SWITCHES

[76] Inventor: Philip C. Sefton, 51 Midhurst Rd., London W13 9XS, England

[21] Appl. No.: 726,055

[22] Filed: Sep. 23, 1976

[30] Foreign Application Priority Data

Sep. 23, 1975 [GB] United Kingdom ............... 38950/75

[51] Int. Cl.$^2$ ............................................ H01H 35/00
[52] U.S. Cl. ................................. 307/116; 340/365 C
[58] Field of Search .................... 307/116; 361/181; 340/365 C; 200/DIG. 1; 328/5

[56] References Cited

U.S. PATENT DOCUMENTS

| 3,660,838 | 5/1972 | Gove et al. | 340/365 C |
| 3,879,618 | 4/1975 | Larson | 307/116 |
| 3,992,634 | 11/1976 | Larson | 307/116 |

OTHER PUBLICATIONS

Williams, J. A., Touch Sensing Circuit, IBM Technical Disclosure Bulletin, 6/74, pp. 166–167.

Primary Examiner—Robert K. Schaefer
Assistant Examiner—Eugene S. Indyk

[57] ABSTRACT

A touch switch having two electrodes, one of which is driven by a pulse signal having a fast leading edge, and the other of which is connected to a logic detector circuit which is selectively triggered by said leading edge. The detector circuit operates to compare the pulse signal passed via the electrodes with one passed directly from the drive pulse generator, and gives an output to a triac trigger circuit dependent upon the amplitude of the signal coupled from one electrode to the other.

9 Claims, 10 Drawing Figures

TOUCH SWITCHES

This invention relates to touch switches and is particularly concerned with a method and apparatus for controlling such switches.

Known touch switches operate by a user placing his finger, or other part of the anatomy, against an electrode which causes, by virtue of a change in capacitance, a change in a parameter of a control circuit connected to the electrode. This change in the parameter causes the control circuit to pass a signal to a trigger circuit which operates a triac or similar device to switch the main current to the load.

In some touch switches, a plurality of capacitively coupled electrodes are used, and a signal is coupled into one of these electrodes and is taken from another electrode and fed to the control circuit. The presence or absence of a user's finger affects the capacitance between the electrodes, and results in a parameter of the signal coupled into the second mentioned electrode being changed. This change in the parameter of the signal can be used to control the triac, as before.

The present invention is concerned with a touch switch of this latter type.

According to the invention there is provided a touch switch comprising two capacitively coupled electrodes arranged such that the capacitive coupling therebetween can be altered by the presence or absence of part of a user's body, a drive pulse generator, the output of which is connected to a first of said electrodes, and a logic detector circuit having a first input connected to receive the output from the second of said electrodes and a second input connected to receive a control pulse signal derived from the output of the drive pulse generator, the logic circuit being operable to detect the difference in amplitude between the signals applied to the inputs to detect the presence or absence of a part of a user's body and to generate a control signal in accordance therewith to initiate a switching action.

In order that the invention may be better understood several embodiments thereof will now be described by way of example only and with reference to the accompanying drawings in which.

Figure 1:
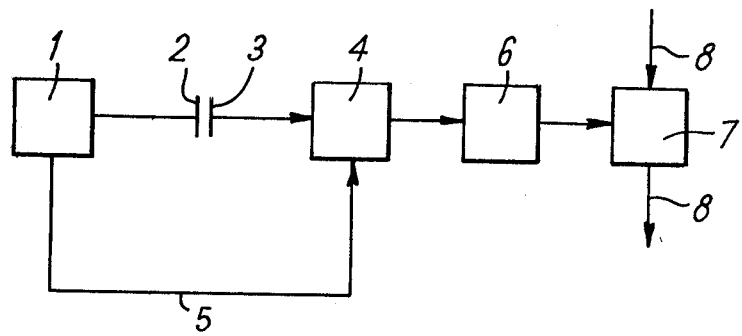
FIG. 1 is a block diagram of a touch switch according to the present invention.
Figure 3:
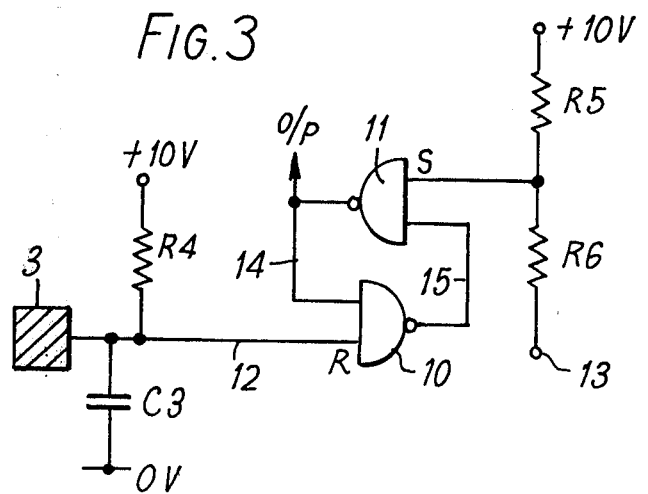
Figure 4:
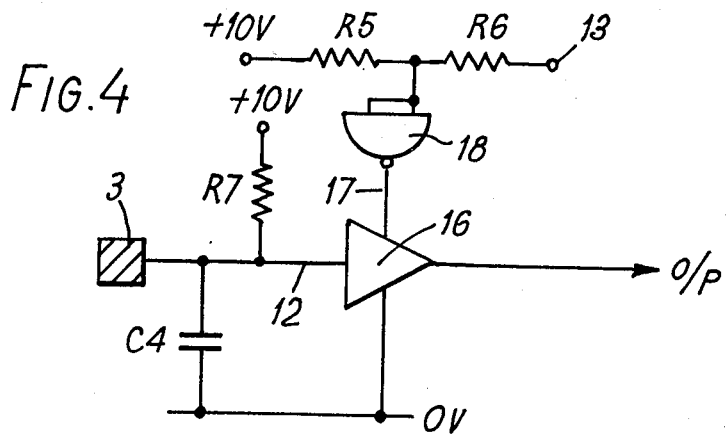
Figure 5:
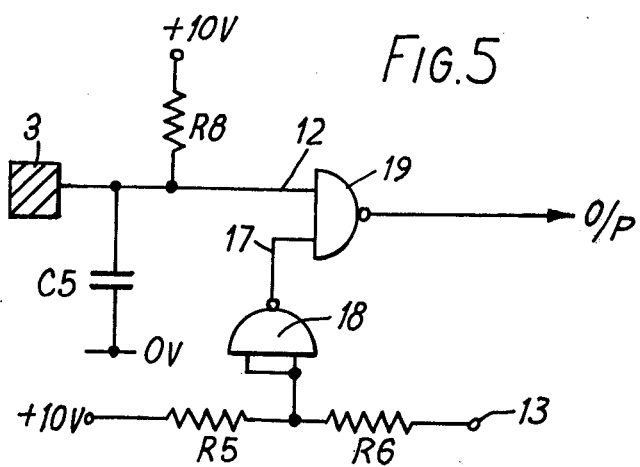
Figure 6:
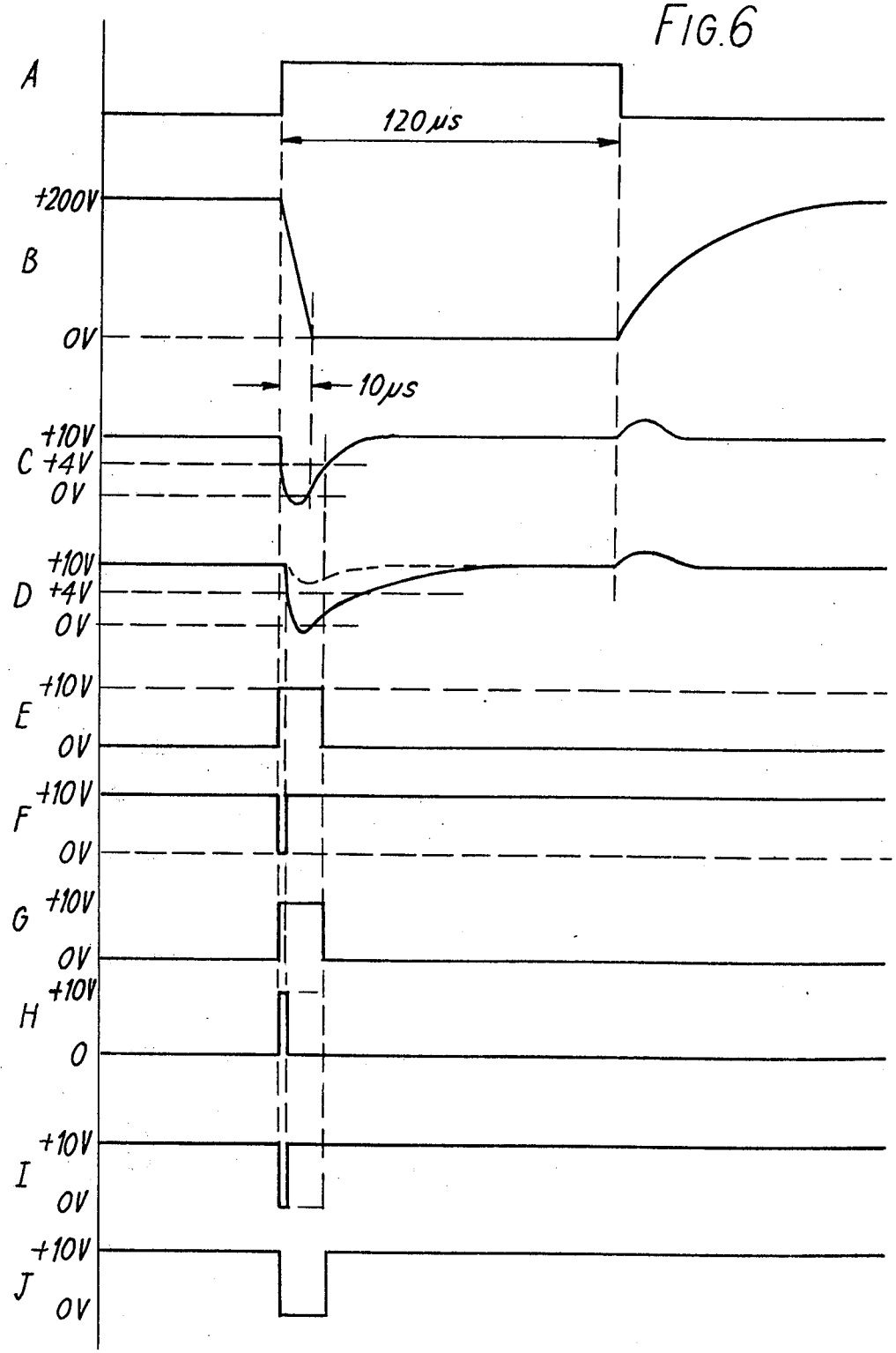
Figure 7:
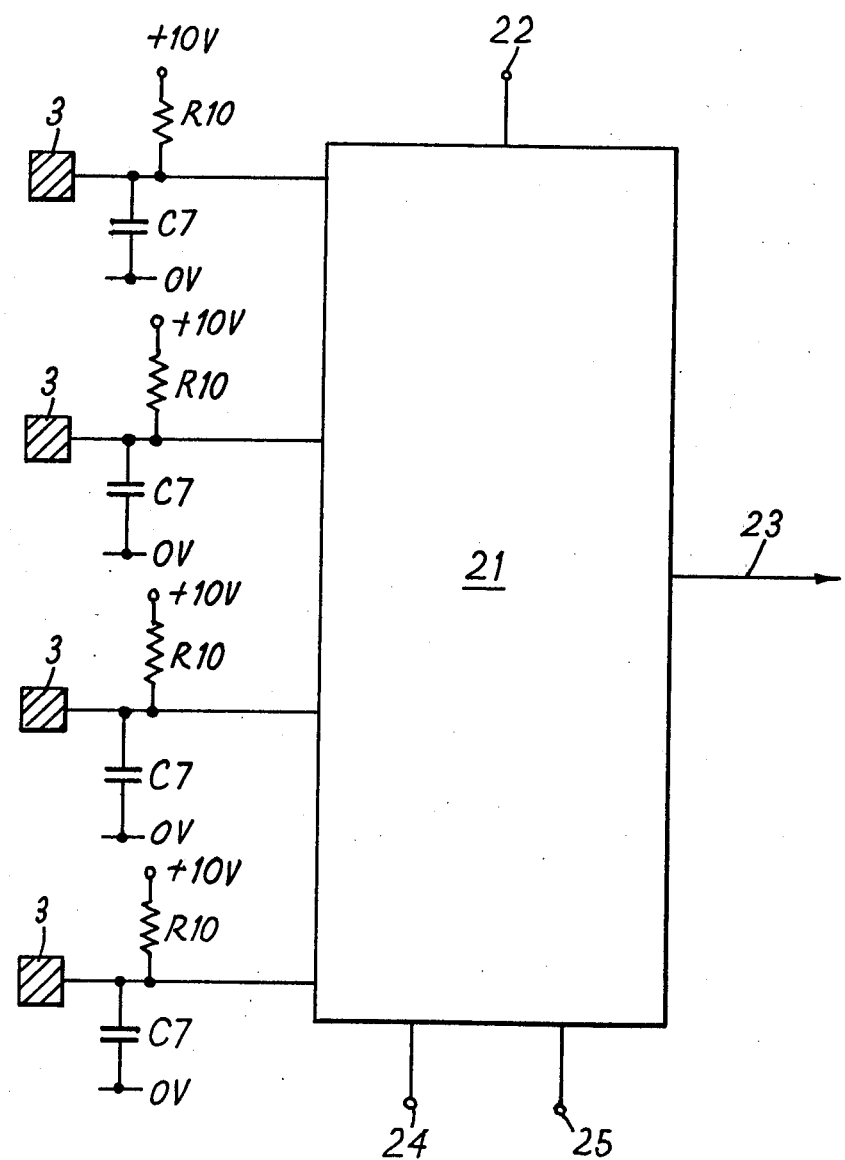
Figure 8:
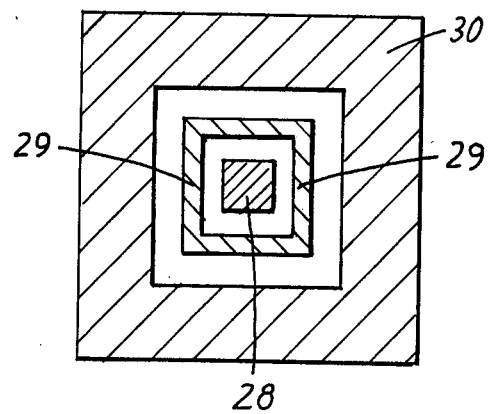
Figure 9:
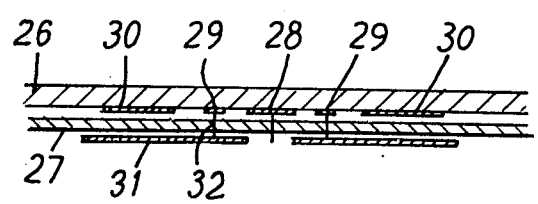

FIGS. 3, 4, and 5 are circuit diagrams each showing a different embodiment of the logic detector circuit of FIG. 1;

FIG. 6 is a series of graphs showing the voltage waveforms in various parts of the circuits of FIGS. 2 to 5;

FIG. 7 is a circuit diagram of a logic detector circuit for use with a multi-electrode touch switch;

FIG. 8 is a diagrammatic view showing one suitable pattern of electrodes for the touch switch of FIGS. 1 to 7;

FIG. 9 is a diagrammatic side view of the electrodes of the touch switch; and

Figure 10:
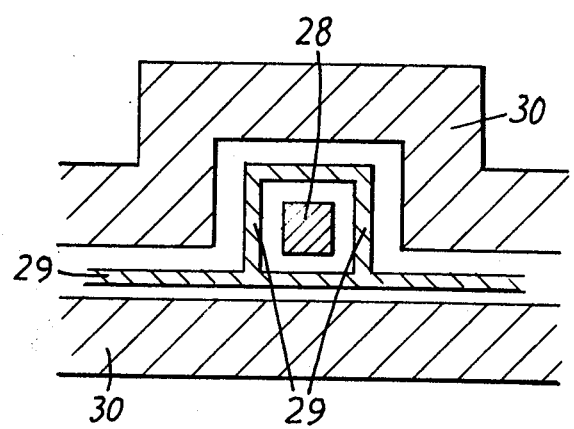

FIG. 10 is a diagrammatic view showing one suitable pattern of electrodes for a multi-electrode touch switch.

Referring to FIG. 1, the touch switch comprises a drive pulse generator 1 the output of which is fed to a first electrode 2. The electrode 2 is capacitively coupled (as represented by the capacitor symbol) with a second electrode 3 which is connected to a first input of a logic detector circuit 4. A further output from the drive pulse generator 1 passes via lead 5 to a second input of the detector circuit 4.

One particular arrangement of the electrodes 2 and 3 will be described hereafter but, whatever arrangement is used, it is necessary that the drive pulse signal coupled from electrode 2 to electrode 3 be changed, preferably reduced, in amplitude at electrode 3 when the capacitive coupling between the electrodes is changed by the presence of a user's finger. The detector circuit effectively compares the signal from electrode 3 with that received directly from the drive pulse generator via lead 5 and gives an output signal dependent upon whether a finger is present or absent, as dictated by the amplitude of the signal coupled into electrode 3.

The output from the detector circuit is passed to a trigger circuit 6 which operates the trigger electrode of a triac 7 or similar device to control the load current 8 through the triac. The trigger circuit and triac are conventional and will not be described further. The output from the detector circuit 4 may be a d.c. signal, or may be a pulse signal and the type of trigger circuit employed will obviously depend upon which type of output signal is used. A pulse output signal is particularly useful as it enables the touch switch of this invention to be used to control the magnitude of the current passed to the load, rather than merely switching it on or off. This may be achieved by the user holding his finger in position against the electrode while "counting" up the pulses which are displayed digitally on a control panel. When the required setting, as seen on the display, is reached the user releases his finger, and the load current is set at that level. Such an arrangement finds uses in control of certain domestic appliances, such as electric cookers and a further description is to be found, for example, in British Patent Application No. 47992/75.

As will be explained hereafter, the detector circuit is arranged to operate on the leading edge of each of the pulses received by it. This means that the leading edge of the pulse plays an important part in the operation of the device, the shape of the remainder of the pulse being relatively unimportant. One example of a suitable drive pulse is shown in FIG. 6B. It will be seen that the drive pulse comprises a relatively fast falling leading edge, followed by a flat bottom and finally a slow rise to the base level. The exact rate of fall of the leading edge is unimportant, but a typical value is 30 volts/microsecond. The higher the peak amplitude of the pulse, the better the immunity of the system to external interference. A typical peak value is 300 volts. The pulse repetition frequency of the drive pulse signal is also relatively unimportant, but will normally be relatively low, typically three pulses per second. The low pulse repetition frequency enables a user to hold his finger on the touch switch to "count" pulses, as required in the continuous control touch switches such as described in application No. 47992/75.

Figure 2:
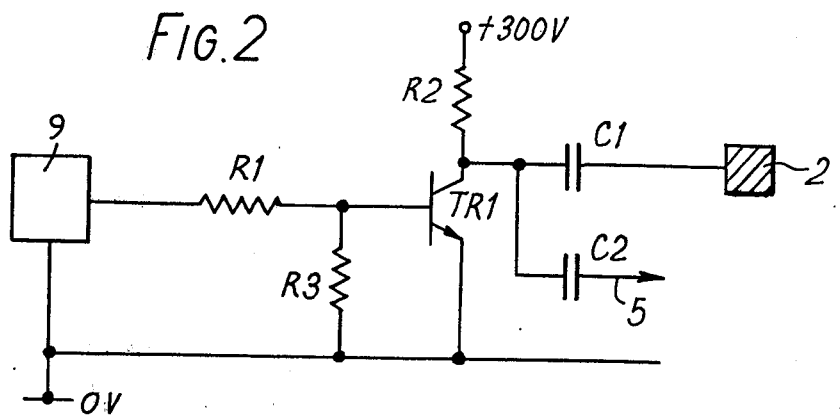
FIG. 2 is a circuit diagram of one embodiment of the drive pulse generator of FIG. 1.

Referring now to FIG. 2, there is shown a drive pulse generator suitable for use in the touch switch of FIG. 1. The drive pulse generator comprises a pulse generator 9 having an output pulse somewhat as shown in FIG. 6A. The pulse repetition frequency is typically three pulses per second, the pulse width typically 120$\mu$S, and the amplitude low, for example 5 to 10 volts.

The output of generator 9 is passed via a resistor R1 to the base of a transistor TR1. The collector of TR1 is connected via an isolating capacitor C1 to the electrode 2. The collector also connects via resistor R2 to a positive supply of 300 volts. Normally therefore, when transistor TR1 is switched OFF, the voltage level at its collector is 300V. Each pulse from the generator 9 causes transistor TRL to switch hard ON, thus causing a rapid fall in the collector voltage from 300 volts to substantially zero. The voltage takes approximately 10µS to fall from +300V to zero, as shown in FIG. 6B.

Transistor TR1 remains ON for the duration of the pulse and turns OFF after the pulse has ended. The collector voltage of TR1 thence rises relatively slowly to the +300V level where it remains until the next pulse appears. After the leading edge, the exact shape of the drive pulse is unimportant, provided it has returned to the +300V level before the next pulse.

The output from the drive pulse generator to line 5 is taken via the isolating capacitor C2 from the collector of transistor TR1.

FIGS. 3 to 5 show various forms of logic detector circuits which can be used with the touch switch of FIG. 1. Referring to FIG. 3, the output from the electrode 3 is passed to a set-reset flip-flop comprising a pair of cross-coupled NAND gates 10,11. The lead 12 from the electrode 3 to the RESET input of the flip-flop is normally at a d.c. potential of 10 volts (logic 1), by virtue of its connection, through a high-value resistor R4 (3.9 M Ω), to a positive supply of 10 volts. Similarly, the SET input of the flip-flop is normally kept at a positive potential of 10 volts (logic 1) by virtue of its connection through a resistor R5 of lower value (e.g. 150 K Ω) to a positive supply of 10 volts. The set input of the flip flop is also connected, via resistor R6 to an input terminal 13 to which the line 5 from the drive pulse generator is connected. The resistor R6 protects the input of the flip-flop from the high voltage at the collector of TR1.

The capacitor C3 at the RESET input to the flip flop has a value dependant upon the physical construction of the electrodes 2 and 3. The capacitor is arranged to form a capacitive potential divider with the capacitance between electrodes 2 and 3, in order to reduce the high voltage at the output of the drive pulse generator to a safe level for the input of the logic circuit.

The NAND gates 10 and 11 are preferably integrated circuit types and, in the embodiment illustrated, are two gates from a CMOS quad 2-input NAND gate integrated circuit, type MC14011 CP. The d.c. voltage supplied to operate the gates is +10 volts, and the trigger level at the gate inputs is +4 volts.

The input signals to the SET and RESET inputs of the flip flop are shown in FIGS. 6C and D respectively, and both will be seen to take up the +10V level (logic 1) most of the time, due to the resistors R5 and R4 respectively. As the voltage at the collector of TR1 falls rapidly — see FIG. 6B — this voltage change with time is transmitted through the capacitor C2 (FIG. 1) into the potential divider formed by resistors R5 and R6. The values of these resistors are such as to restrict the amplitude at the SET input to a safe level. The amplitude of the SET input signal falls from its 10 volts level at, for example, half the rate of the voltage at the collector of TR1 (i.e. 15 volts/microsecond), and soon reaches the zero voltage level, at which level it is clamped by the back to back diodes provided at the input of each gate in the CMOS integrated circuit. The small overshoot apparent from the graph is due to the offset of these diodes. As soon as the voltage at the collector of TR1 stops falling, the voltage at the set input starts to rise, at a rate dependent on the value of resistor R5, to the +10 volts level.

The input voltage to the RESET input, arriving via the electrodes 2 and 3 is similar in shape, the two significant differences being firstly, as shown in FIG. 6, a small delay occurs in the arrival of the pulse via the electrodes 2 and 3, due to a slightly increased propagation time for this pulse, and secondly the rise of voltage from the zero level back to +10 volts is slower due to the fact that the resistor R4 has a higher value than that of resistor R5. The full line in FIG. 6D illustrates the condition where no finger is present adjacent the electrodes 2 and 3. In this embodiment, it is necessary that the presence of a finger reduces the voltage coupled into the electrode 3, and this output voltage is shown by dotted lines in FIG. 6D. Similarly, the use of a full line in FIGS. 6E to J illustrates the condition when no finger is present, while the use of a dotted line illustrates the condition when a finger is present.

The operation of the flip-flop will be explained further with additional reference to FIGS. 6E and F which show respectively the waveforms at lines 14 and 15 respectively of the flip-flop. It is assumed initially that no finger is present adjacent electrodes 2 and 3. Before the start of the pulse, both inputs are at logic 1 level. The first input to go to logic 0 level is the SET input (FIG. 6C), and this results in the line 14 taking up a logic 1 potential of +10 volts (FIG. 6E) and line 15 taking up a logic 0 potential of zero volts (FIG. 6F). Next, the slightly delayed RESET pulse (FIG. 6D) goes to the logic 0 level and this results in the line 14 remaining at the logic 1 potential, while the line 15 takes up the logic 1 potential. The SET pulse is the first to rise to the logic 1 level, and this results in the line 14 taking up the logic 0 level while the line 15 remains at the logic 1 level. Finally, the RESET pulse rises to the logic 1 level, so that both inputs are at logic 1, and the state of the flip flop remains unchanged until the next pulse arrives.

The operation of the flip-flop will now be explained in the event that a finger is present adjacent electrodes 2 and 3. The SET input first falls to the logic 0 level, resulting in line 14 going to logic 1 level and line 15 to logic 0 level. The RESET input never falls sufficiently to trigger the flip-flop at the +4 volts level, and so lines 14 and 15 remain unchanged. Next the SET input once more rises to the logic 1 level, so that both inputs are at logic 1 level, so that the logic levels on lines 14 and 15 once more remain unchanged until the next pulse.

The output of the detector circuit is taken from line 14 to the trigger circuit 6 (FIG. 1). It will be seen that the output signal comprises, in the presence of a finger, a d.c. potential of +10 volts and, in the absence of a finger, a d.c. potential of zero volts with a very short duration (~10µs) pulse every ⅓ second (assuming a pulse repitition frequency of three pulses per second). These signals can be further processed in a conventional manner to effect the desired switching action.

A second embodiment of detector circuit will now be described with reference to FIG. 4. Identical reference numerals are used where appropriate. In FIG. 4, the signal coupled into electrode 3 is passed to the input of a non-inverting digital buffer 16. Preferably the buffer 16 forms part of a multi-element CMOS integrated circuit, for example type MC14050 CP. Resistor R7 and capacitor C4 have the same purpose as resistor R4 and capacitor C3 in FIG. 3. The positive power supply to buffer 16 is supplied via a lead 17 from a digital inverter element in the form of a CMOS NAND gate 18 the outputs of which are connected together, as shown. As inspection of FIG. 4 will show, the input to NAND gate 18 is identical with that of NAND gate 11 of FIG. 3, i.e. the waveform shown in FIG. 6C. The NAND gate 18 inverts and squares off the pulse shown in FIG. 6C, and the output on line 17 is illustrated in FIG. 6G. It will be seen, therefore, that the buffer 16 is only powered for a short period every ⅓ of a second, this short period corresponding to the time when a pulse from electrode 3 might be expected. The pulse from electrode 3 takes the form shown in FIG. 6D. During the time that the buffer is not powered, its output remains at the zero level, as shown in FIG. 6H. However, as soon as power is applied and assuming no finger is present, the output rises momentarily to the +10 volt level of the power supply before returning almost immediately to the zero voltage level due to triggering of the buffer 16 by the input signal (FIG. 6D). If a finger is present, then the input to buffer 16 never rises to a sufficient amplitude to cause triggering, and a positive pulse of amplitude 10 volts and duration 10µS results, see FIG. 6H.

Thus the output of buffer 16 is a 10µS pulse every ⅓ of a second if a finger is present and substantially zero (broken only by a very short duration pulse) if a finger is not present.

A third embodiment of a detector circuit is shown in FIG. 5 which is very similar to that shown in FIG. 4 with the exception that a CMOS NAND gate 19 is triggered by the signal on line 17, shown in FIG. 6G. The resistor R8 and capacitor C5 serve the same purpose as the resistor R4 and capacitor C3 in FIG. 3. The output of NAND gate 19 is shown in FIG. 6I. Normally the inputs to the gate 19 are different — logic 1 on lead 12 (FIG. 6D) and logic 0 on lead 17 (FIG. 6G). The output from the gate is thus normally at a logic 1 level (+10 volts). When the input on line 17 rises to the logic 1 level, the output momentarily falls to logic 0, before rising again almost immediately to logic 1 when the input on line 12 falls to the logic 0 level. Thereafter the output remains at the logic 1 level. If a finger is present, the input on line 12 never reaches the 0 level, so the output takes the form of the input on line 17, only inverted.

The embodiments thus far described assume that a high drive voltage, of the order of 300 Volts is used. The circuits will operate, with reduced noise immunity, down to a drive voltage of about 50 Volts, but below this the signal picked up by the electrode 3 is not sufficient to trigger the detector circuit to operate correctly.

It should be noted that the effect of the very short duration pulses shown in FIGS. 6F, H and I resulting from the slight propagation delay of the FIG. 6D pulse can be eliminated by the use of logic devices having a slow response. Alternatively, the same effect can be achieved by deliberately delaying the pulse of FIG. 6C.

FIG. 7 shows how a multi-electrode touch switch can be arranged to give a programmable multiplex switching operation. Each of the electrodes 3 is driven from a common electrode 2 with a signal similar to that shown in FIG. 6B. Each of the resistors R10 and capacitors C7 serve the same purpose as resistor R4 and capacitor C3 of FIG. 3. The four electrodes 3 are connected to respective inputs of a dual quad multiplex integrated circuit 21. The input circuits of the integrated circuit 21 act in a similar manner to NAND gates. The second inputs of these pseudo NAND gates in the integrated circuit 21 are commoned and connected to a terminal 22 which connects via processing circuitry to line 5 of the drive pulse generator 1. This processing circuitry is operable to provide a control pulse signal having the waveform of FIG. 6J. The operation of the NAND gates in integrated circuit 21 is similar to that described previously with reference to FIG. 5 and will be clear to those skilled in the art.

The integrated circuit 21 is also provided with a programmable multiplexing facility, which enables one NAND gate output at a time to be chosen to proceed to the output line 23. Which gate is chosen depends upon the logic signal supplied to the address input terminals 24, 25. If suitable pulse waveforems are supplied to terminals 24 and 25, the individual outputs from the four NAND gates can be time multiplexed onto a single line 23. A suitable integrated circuit is type MC14539.

Referring now to FIGS. 8 and 9, there is shown a suitable electrode arrangement for use with the touch switch of this invention. The arrangement comprises an insulating sheet 26 of glass, perspex or other insulating material, which sheet forms the panel which the user touches when wishing to operate the switch. A backing board 27 is positioned behind the sheet 26 and, sandwiched between the two, are a plurality of electrodes 28, 29, 30 formed into the pattern shown in FIG. 8. The electrodes may be attached to the sheet 26, the board 27, or both. Conventional printed circuit techniques can be used in the formation of the electrodes, or they may be formed from conducting paint. A ground plate 31, for example of copper sheet, may additionally be formed on the rear side of board 27 to provide greater immunity from interference. The backing board 27, while being advantageous, is not essential.

The thickness of the sheet 26 is not critical, and thicknesses up to 6mm are suitable. Suitable electrode thicknesses are between 0.03 mm and 0.1 mm.

The electrodes 28, 29 and 30 are arranged as shown in FIG. 8. The drive pulse signal from generator 1 is applied to the electrode 30, which corresponds to electrode 2, and the pulse signal for the detector circuitry is taken from electrode 28, which corresponds to electrode 3. Electrode 29 which is desirable, but not essential, is a common electrode which is connected to the system chassis, or ground. If a ground plate 31 is provided, connections 32 with the electrode 29 are also provided, as shown in FIG. 9.

The sizes and shapes for the electrodes 28, 29 and 30 are optimum for use with the finger, but the principle applies to larger or smaller sizes, and the shape of electrode 28 may be varied to suit the particular circumstances. For example, the electrode 28 may be square (as shown), circular or rectangular. In the embodiment illustrated, the electrode 28 is a square of 8 mm set side, and a 1 mm gap exists between electrodes 28 and 29 and between electrodes 29 and 30. The electrode 29 is 2 mm in width, and the electrode 30 is 12 mm in width.

The electrodes operate as follows:

When no finger is present on top of the sheet 26 the drive pulse signal fed into the electrode 30 is capacitively coupled through the air space above the sheet 26 to the electrode 28. When a finger is placed above the electrode 28, the capacitive coupling falls, some of the signal being lead away through the finger into the ground electrode 29. This is because of the greater capacitive coupling existing between the finger and the electrode 29 than between the finger and the electrode 30. The size of the electrodes is such that the edges of the finger almost cover the ground electrode 29 but are not able to cover the input electrode 30. In addition, when a finger is placed on the sheet 26, some of the signal is absorbed by the body through its considerable capacitance to ground.

Since the output at electrode 28 consists of an electrical voltage which is reduced in the presence of a finger touching the defined place, it is possible to define a figure of merit for the electrode arrangement, which will be referred to hereinafter as the "output ratio." For example, the output ratio is 2 if the voltage at the electrode 28 with a finger present is 50% of the voltage at the electrode 28 with no finger present.

In the event that the sheet 26 is covered wholly or partly with water, the dielectric path length between the electrodes 30 and 28 is shortened and, all other things being equal, the output voltage from the electrode 28 increases. However, as a finger is placed above the electrode 28, touching the sheet 26 on which the water lies, the output voltage reduces to approximately that value obtained without the presence of the water. The detecting circuit therefore needs no modification to accommodate the presence of water. If, however, the water is grounded by contact with grounded metal nearby, the "output ratio" is reduced and the detector circuit may not be able to interpret the finger's presence correctly. In order to avoid this problem, the top surface of the sheet 26 may itself be provided with a conductive area, for example a 12 mm diameter disc, centrally placed over the electrode 28 underneath. While the "output ratio" is improved only slightly, the finger need not be placed directly on top of the sheet to operate the switch. In fact, it is only required to make physical contact somewhere on the conductive area for the output at the electrode 28 to be reduced. This conductive area may be made, for example, of copper, or may be painted on with conductive paint. A similar effect is obtained if this area is embedded just below the surface of the sheet 26 so that the top of the sheet is actually electrically insulating. This latter approach is to be preferred where there is a likelihood of water on the sheet 26, and where the sheet has a grounded metal surround. The "output ratio" under these conditions is higher than when the top conductive area is exposed.

FIG. 10 shows part of an electrode arrangement which may be used where it is desired to drive a number of electrodes 28 from a single electrode 30, for example for use with the embodiment of FIG. 7. The drawing is self explanatory, and will not be explained in detail except to note that at the extremeties of the electrode arrangement, the two parts of the electrode 30 would be joined together. Using the arrangement of FIG. 10, any number of electrodes 28 can be driven from a common electrode 30.

In addition, a multielectrode arrangement such as shown in FIG. 10 can be used in conjunction with a plurality of individual detector circuits such as shown in FIGS. 3 to 5. For example, in one arrangement, one electrode 28 is connected to a detector of the type shown in FIG. 3, while a number of other electrodes 28, driven from a common drive pulse generator 1, are connected to detectors of the type shown in FIG. 4.

Although specific examples of detector circuits have been shown in FIGS. 3 to 5, it will be apparent to those skilled in the art that other digital circuits could be used depending upon the particular requirements of the system and the available logic circuits. The circuit of FIG. 5 could, for example, easily be modified for use with other logic gates. Although described in relation to a touch switch, the invention could be used in the wider field of proximity detection for detecting the presence of metallic and other wholly or partially conducting materials, and the above description is intended to include such an application.

It will also be appreciated that various other modifications could be made to the above described embodiments while remaining within the scope of this invention. For example, the use of a drive pulse signal having a negative going edge is a matter of convenience only and a positive going edge could be used equally as well. The shape of the remainder of the drive pulse, after the leading edge, is unimportant, and only needs to be returned to its original level before the next pulse occurs, usually about one third of a second later. Compensation for changes in supply voltage can be effected by tying both the 300 volt d.c. supply and the 10 volt d.c. supply together so that variations are proportionally the same.

It will also be appreciated that the detector circuits could be simplified, when it is desired to detect from a plurality of electrodes 28, by the use of multi-input gates.

It may prove desirable under certain circumstances, for example if the drive pulse generator and the detector circuits are physically separated from one another, to separate the "0 volt" lines of the input and output circuits, giving them different d.c. potentials. It has been found that, provided all the "0 volt" lines are a.c. decoupled between themselves, the circuits will operate satisfactorily. A 0.001 $\mu$F capacitor, for example, may be placed between each "0 volt" line and ground to effect such decoupling.

The electrodes 28, 29 and 30 may be etched in the copper surface of a very thin flexible single sided printed circuit board made of epoxy-glass or polyester resin material. This composite sheet may be attached by double-sided adhesive tape or by other bonding means to the lower surface of sheet 26 to make up the electrode arrangement of FIGS. 8, 9 or 10. Preferably the copper face is exposed underneath to aid electrical connections to the electrodes.

It should be noted that the voltage levels given throughout the above description are by way of example only, and may need to be modified if different types of logic circuitry, for example TTL or TSL are used.

Although the above touch switch has been described in relation to a load current switching action, the uses of touch switches extends over a much broader field, for example in direct instrumention control, and it is intended that this invention should cover the use of the touch switch in its broadest aspects.

I claim:

1. A touch switch comprising: a first and at least one second capacitively coupled electrodes positioned relative to each other for altering the capacitive coupling therebetween by the presence or absence of part of a user's body; a drive pulse generator having an output terminal connected to a first of said electrodes and operable to produce an output pulse signal having a leading edge in the form of a steep ramp, followed by a relatively slow returning edge; a logic detector circuit having an output terminal and two input terminals, the first of said input terminals being connected to receive the output from the second of said electrodes, the detector circuit being operable to trigger or fail to trigger in accordance with the amplitude of the signal applied to said first input terminal to thereby detect the presence or absence of a part of a user's body and to generate, at its output terminal, a control signal in accordance therewith to initiate a switching action; means connected to the output terminal of the drive pulse generator for generating, from said output pulse signal, a control pulse signal comprising a series of pulses each substantially coincident in time with the leading edge of a respective pulse of said output pulse signal; and means connected between the control pulse signal generator and the second input terminal of said logic detector circuit for applying the control pulse signal to said second logic input terminal for causing the detector circuit to act on the signal applied to said first input terminal only for the duration of each control pulse.

2. A touch switch according to claim 1 wherein the detector circuit comprises a flip-flop having two inputs constituting respectively said first and second input terminals of the detector circuit, and wherein each control pulse produced by said detector circuit has sufficient magnitude to trigger the flip-flop, and each pulse received from the second electrode has an amplitude for triggering the flip-flop only in the presence of a part of a user's body at said capacitively coupled electrodes.

3. A touch switch according to claim 1 wherein the detector circuit comprises a logic buffer having a power supply terminal constituting said second input terminal and a data input constituting said first input terminal, whereby the buffer is supplied with power only during each control pulse of the control pulse signal.

4. A touch switch as claimed in claim 1 wherein the detector circuit comprises a logic gate having two inputs respectively constituting said first and second input terminals of the detector circuit and wherein each control pulse produced by said detector circuit has magnitude to trigger the gate and each pulse received from the second electrode has an amplitude for triggering the gate only in the presence of a part of a user's body at said capacitive coupled electrodes.

5. A touch switch according to claim 1 wherein said drive pulse generator comprises a pulse generator having an output a switching transistor having the pulse generator output connected the base electrode thereof for control of said transistor, a high voltage source and a resistor, the collector electrode of said transistor being connected to the output terminal of the drive pulse generator and to said high voltage source through said resistor.

6. A touch switch according to claim 1 wherein there is a plurality of said second electrodes, and said plurality of second electrodes are capacitively coupled to a single one of said first electrodes, and a plurality of detector circuits, one connected to each of said second electrodes.

7. A touch switch according to claim 6 further comprising means connected to said detector circuits for time multiplexing the outputs from the respective detector circuits onto a single output line.

8. A touch switch according to claim 1 wherein the electrodes are thin conductive sheets and said switch further comprises a rigid sheet of insulating material having said electrodes on one side thereof.

9. A touch switch according to claim 8 wherein the electrodes are arranged on the insulating sheet in a concentric pattern, with the first electrode enclosing each second electrode, and further comprising a third electrode formed concentrically between the first and second electrodes, said third electrode being connected to a reference potential or ground.

* * * * *